US010660245B2

(12) United States Patent
Dunn et al.

(10) Patent No.: US 10,660,245 B2
(45) Date of Patent: May 19, 2020

(54) BACK PAN COOLING ASSEMBLY FOR ELECTRONIC DISPLAY

(71) Applicant: Manufacturing Resources International, Inc., Alpharetta, GA (US)

(72) Inventors: William Dunn, Alpharetta, GA (US); Mike Brown, Alpharetta, GA (US); Tim Hubbard, Alpharetta, GA (US)

(73) Assignee: MANUFACTURING RESOURCES INTERNATIONAL, INC., Alpharetta, GA (US)

( * ) Notice: Subject to any disclaimer, the term of this patent is extended or adjusted under 35 U.S.C. 154(b) by 420 days.

(21) Appl. No.: 14/055,499

(22) Filed: Oct. 16, 2013

(65) Prior Publication Data

US 2014/0113540 A1     Apr. 24, 2014

Related U.S. Application Data

(60) Provisional application No. 61/714,381, filed on Oct. 16, 2012.

(51) Int. Cl.
    H05K 7/20    (2006.01)
(52) U.S. Cl.
    CPC ................... H05K 7/20972 (2013.01)
(58) Field of Classification Search
    CPC .............................. H05K 7/20; H05K 7/20972
    USPC ......................................................... 454/184
    See application file for complete search history.

(56) References Cited

U.S. PATENT DOCUMENTS

| 4,093,355 A | 6/1978 | Kaplit et al. |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |

(Continued)

FOREIGN PATENT DOCUMENTS

| AU | 2011248190 B2 | 5/2011 |
| CN | 2702363 Y | 5/2005 |

(Continued)

OTHER PUBLICATIONS

Zeef, Hubing, EMC analysis of 18' LCD Monitor, Aug. 2000, 1 page.

(Continued)

Primary Examiner — Grant Moubry
Assistant Examiner — Ryan L Faulkner
(74) Attorney, Agent, or Firm — Standley Law Group LLP; Jeffrey S. Standley; Adam J. Smith

(57) ABSTRACT

Exemplary embodiments disclosed herein provide a back pan cooling assembly for an electronic display having a rear pan. A cooling back pan is preferably positioned behind the rear pan, the space between the cooling back pan and the rear pan defining a gap. A fan is positioned to cause a flow of ambient air through the gap. An electronic component for driving the electronic display may be placed in conductive thermal communication with the cooling back pan. A rear cover can be placed against the cooling back pan to define a sealed compartment which does not permit ambient air to enter. A port can be provided within the rear cover which allows ambient air to travel between the surroundings, the fan, and the gap.

15 Claims, 2 Drawing Sheets

(56) References Cited

U.S. PATENT DOCUMENTS

| | | |
|---|---|---|
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,247,374 A | 9/1993 | Terada |
| 5,282,114 A | 1/1994 | Stone |
| 5,293,930 A | 3/1994 | Pitasi |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A | 11/1999 | Heady et al. |
| 6,003,015 A | 12/1999 | Kang et al. |
| 6,007,205 A | 12/1999 | Fujimori |
| 6,089,751 A | 7/2000 | Conover et al. |
| 6,104,451 A | 8/2000 | Matsuoka et al. |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida |
| 6,473,150 B1 | 10/2002 | Takushima et al. |
| 6,476,883 B1 * | 11/2002 | Salimes ............... H05K 5/0017 345/156 |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,683,639 B2 | 1/2004 | Scheper |
| 6,714,410 B2 | 3/2004 | Wellhofer |
| 6,727,468 B1 | 4/2004 | Nemeth |
| 6,825,828 B2 | 11/2004 | Burke et al. |
| 6,839,104 B2 | 1/2005 | Taniguchi et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,587 B2 | 3/2007 | Kim et al. |
| 7,209,349 B2 | 4/2007 | Chien et al. |
| 7,212,403 B2 | 5/2007 | Rockenfeller |
| 7,269,023 B2 | 9/2007 | Nagano |
| 7,284,874 B2 | 10/2007 | Jeong et al. |
| 7,396,145 B2 * | 7/2008 | Wang ............... G02F 1/133604 315/309 |
| 7,452,121 B2 | 11/2008 | Cho et al. |
| 7,457,113 B2 * | 11/2008 | Kumhyr ............... G06F 1/203 165/80.3 |
| 7,480,140 B2 | 1/2009 | Hara et al. |
| 7,535,543 B2 | 5/2009 | Dewa et al. |
| 7,602,469 B2 | 10/2009 | Shin |
| D608,775 S | 1/2010 | Leung |
| 7,667,964 B2 * | 2/2010 | Kang et al. .................. 361/692 |
| 7,752,858 B2 | 7/2010 | Johnson et al. |
| 7,753,567 B2 | 7/2010 | Kang et al. |
| 7,762,707 B2 * | 7/2010 | Kim ............... G02F 1/133603 362/373 |
| 7,800,706 B2 * | 9/2010 | Kim ............... G02F 1/133608 349/58 |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 * | 8/2011 | Dunn ............... G02F 1/133385 349/161 |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 * | 6/2012 | Dunn ............... H05K 7/20972 349/161 |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 * | 8/2012 | Lee ............... H05K 7/20972 361/695 |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 * | 1/2013 | Dunn ............... G02F 1/133385 349/161 |
| 8,358,397 B2 | 1/2013 | Dunn |
| 8,369,083 B2 * | 2/2013 | Dunn ............... G02F 1/133385 349/161 |
| 8,373,841 B2 | 2/2013 | Dunn |
| 8,379,182 B2 | 2/2013 | Dunn |
| 8,400,608 B2 * | 3/2013 | Takahashi ............... G09F 9/35 349/161 |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,649,170 B2 | 2/2014 | Dunn et al. |
| 8,649,176 B2 * | 2/2014 | Okada et al. .................. 361/690 |
| 8,654,302 B2 * | 2/2014 | Dunn ............... G02F 1/133385 165/104.34 |
| 8,678,603 B2 | 3/2014 | Zhang |
| 8,693,185 B2 * | 4/2014 | Dunn ............... G02F 1/133385 361/679.48 |
| 8,700,226 B2 | 4/2014 | Schuch et al. |
| 8,711,321 B2 * | 4/2014 | Dunn ............... H05K 7/20972 349/137 |
| 8,749,749 B2 | 6/2014 | Hubbard |
| 8,755,021 B2 | 6/2014 | Hubbard |
| 8,760,613 B2 * | 6/2014 | Dunn ............... G02F 1/133603 349/161 |
| 8,767,165 B2 | 7/2014 | Dunn |
| 8,773,633 B2 | 7/2014 | Dunn et al. |
| 8,804,091 B2 * | 8/2014 | Dunn ............... G02F 1/133385 349/161 |
| 8,823,916 B2 * | 9/2014 | Hubbard ............ G02F 1/133308 165/104.34 |
| 8,854,572 B2 | 10/2014 | Dunn |
| 8,854,595 B2 | 10/2014 | Dunn |
| 8,879,042 B2 | 11/2014 | Dunn |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,370,127 B2 | 6/2016 | Dunn |

(56) References Cited

U.S. PATENT DOCUMENTS

| | | |
|---|---|---|
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2* | 9/2016 | Yoon .................. H05K 7/20145 |
| 9,470,924 B2 | 10/2016 | Dunn et al. |
| 9,500,896 B2* | 11/2016 | Dunn ...................... A47F 3/043 |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2* | 5/2017 | Dunn ....................... H04N 5/64 |
| 9,723,765 B2 | 8/2017 | DeMars |
| 9,797,588 B2* | 10/2017 | Dunn ................ G02F 1/133308 |
| 9,894,800 B2* | 2/2018 | Dunn ................ G02F 1/133385 |
| 2001/0001459 A1 | 5/2001 | Savant et al. |
| 2001/0019454 A1* | 9/2001 | Tadic-Galeb .......... G02B 13/16 |
| | | 359/649 |
| 2002/0033919 A1 | 3/2002 | Sanelle et al. |
| 2002/0050793 A1 | 5/2002 | Cull et al. |
| 2002/0101553 A1 | 8/2002 | Enomoto et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1* | 10/2002 | Gromatzky ....... G02F 1/133385 |
| | | 349/60 |
| 2002/0164944 A1 | 11/2002 | Haglid |
| 2002/0167637 A1 | 11/2002 | Burke et al. |
| 2003/0007109 A1 | 1/2003 | Park |
| 2003/0020884 A1 | 1/2003 | Okada et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035558 A1 | 2/2004 | Todd et al. |
| 2004/0036834 A1 | 2/2004 | Ohnishi et al. |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0283579 A1* | 12/2006 | Ghosh .................. H01L 23/473 |
| | | 165/104.33 |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1* | 9/2008 | Yamanaka ......... H05K 7/20972 |
| | | 345/60 |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2009/0009047 A1 | 1/2009 | Yanagawa et al. |
| 2009/0009729 A1 | 1/2009 | Sakai |
| 2009/0086430 A1* | 4/2009 | Kang ................ G02F 1/133385 |
| | | 361/695 |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0244472 A1 | 10/2009 | Dunn |
| 2009/0279240 A1 | 11/2009 | Karppanen |
| 2009/0306820 A1 | 12/2009 | Simmons et al. |
| 2010/0060861 A1 | 3/2010 | Medin |
| 2010/0079949 A1* | 4/2010 | Nakamichi ....... G02F 1/133308 |
| | | 361/696 |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1* | 3/2011 | Nakamichi ............ G06F 1/1601 |
| | | 349/161 |
| 2011/0058326 A1 | 3/2011 | Idems et al. |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0114384 A1 | 5/2011 | Sakamoto et al. |
| 2011/0116000 A1 | 5/2011 | Dunn et al. |
| 2011/0122162 A1* | 5/2011 | Sato et al. ..................... 345/690 |
| 2011/0141724 A1 | 6/2011 | Erion |
| 2011/0261523 A1 | 10/2011 | Dunn et al. |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0249402 A1 | 10/2012 | Kang |
| 2012/0255704 A1 | 10/2012 | Nakamichi |

(56) References Cited

U.S. PATENT DOCUMENTS

| | | | |
|---|---|---|---|
| 2012/0274876 A1* | 11/2012 | Cappaert | G02B 6/0085 349/62 |
| 2012/0284547 A1 | 11/2012 | Culbert et al. | |
| 2013/0170140 A1 | 7/2013 | Dunn | |
| 2013/0176517 A1 | 7/2013 | Kim et al. | |
| 2013/0201685 A1 | 8/2013 | Messmore et al. | |
| 2013/0258659 A1 | 10/2013 | Erion | |
| 2013/0294039 A1 | 11/2013 | Chao | |
| 2014/0085564 A1* | 3/2014 | Hendren | G02F 1/133385 349/58 |
| 2014/0111758 A1 | 4/2014 | Dunn et al. | |
| 2014/0113540 A1 | 4/2014 | Dunn et al. | |
| 2014/0184980 A1 | 7/2014 | Onoue | |
| 2014/0313698 A1 | 10/2014 | Dunn et al. | |
| 2014/0314395 A1 | 10/2014 | Dunn et al. | |
| 2015/0264826 A1 | 9/2015 | Dunn et al. | |
| 2015/0319882 A1 | 11/2015 | Dunn et al. | |
| 2015/0366101 A1 | 12/2015 | Dunn et al. | |
| 2016/0041423 A1 | 2/2016 | Dunn | |
| 2016/0044829 A1 | 2/2016 | Dunn | |
| 2016/0192536 A1 | 6/2016 | Diaz | |
| 2016/0195254 A1 | 7/2016 | Dunn et al. | |
| 2016/0198588 A1 | 7/2016 | DeMars | |
| 2016/0238876 A1 | 8/2016 | Dunn et al. | |
| 2016/0242329 A1 | 8/2016 | DeMars | |
| 2016/0242330 A1 | 8/2016 | Dunn | |
| 2016/0249493 A1 | 8/2016 | Dunn et al. | |
| 2016/0302331 A1 | 10/2016 | Dunn | |
| 2017/0023823 A1 | 1/2017 | Dunn et al. | |
| 2017/0068042 A1 | 3/2017 | Dunn et al. | |
| 2017/0074453 A1 | 3/2017 | Bowers et al. | |
| 2017/0083043 A1 | 3/2017 | Bowers et al. | |
| 2017/0083062 A1 | 3/2017 | Bowers et al. | |
| 2017/0111486 A1 | 4/2017 | Bowers et al. | |
| 2017/0111520 A1 | 4/2017 | Bowers et al. | |
| 2017/0111521 A1 | 4/2017 | Bowers et al. | |
| 2017/0127579 A1 | 5/2017 | Hubbard | |
| 2017/0188490 A1 | 6/2017 | Dunn et al. | |
| 2017/0245400 A1 | 8/2017 | Dunn et al. | |
| 2017/0257978 A1 | 9/2017 | Diaz | |

FOREIGN PATENT DOCUMENTS

| | | |
|---|---|---|
| EP | 1408476 A1 | 4/2004 |
| EP | 1647766 | 4/2006 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| GB | 2402205 | 12/2004 |
| GB | 2402205 A | 12/2004 |
| JP | 402062015 A | 3/1990 |
| JP | 402307080 A | 12/1990 |
| JP | 03153212 | 7/1991 |
| JP | 3153212 A | 7/1991 |
| JP | 6082745 A | 3/1994 |
| JP | 8115788 A | 5/1996 |
| JP | 08194437 | 7/1996 |
| JP | 8194437 A | 7/1996 |
| JP | 8339034 A | 12/1996 |
| JP | H09246766 A | 9/1997 |
| JP | 11160727 | 6/1999 |
| JP | 11160727 A | 6/1999 |
| JP | 11296094 | 10/1999 |
| JP | H11296094 A | 10/1999 |
| JP | 2001209126 A | 8/2001 |
| JP | 2002158475 | 5/2002 |
| JP | 2002158475 A | 5/2002 |
| JP | 2004053749 A | 2/2004 |
| JP | 2005017556 A | 1/2005 |
| JP | 2000131682 A | 5/2005 |
| JP | 2005134849 | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2007003638 A | 1/2007 |
| JP | 09307257 | 11/2007 |
| JP | 09307257 A | 11/2007 |
| JP | 2008010361 A | 1/2008 |
| JP | 2008292743 | 12/2008 |
| JP | 2008292743 A | 12/2008 |
| JP | 2010024624 | 2/2010 |
| JP | 2010024624 A | 2/2010 |
| KR | 200366674 Y1 | 11/2004 |
| KR | 20050033986 | 4/2005 |
| KR | 20050033986 A | 4/2005 |
| KR | 200401354 Y1 | 11/2005 |
| KR | 20060016469 | 2/2006 |
| KR | 20060016469 A | 2/2006 |
| KR | 100666961 | 1/2007 |
| KR | 100666961 B1 | 1/2007 |
| KR | 1020070070675 A | 4/2007 |
| KR | 1020070070675 | 7/2007 |
| KR | 1020070048294 | 8/2007 |
| KR | 101764381 B1 | 7/2017 |
| RU | 2513043 C2 | 4/2014 |
| WO | WO2005079129 | 8/2005 |
| WO | WO2005079129 A1 | 8/2005 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | 2013182733 A1 | 12/2013 |
| WO | WO2014149773 A1 | 9/2014 |
| WO | WO2014150036 A1 | 9/2014 |
| WO | WO2015168375 A1 | 11/2015 |
| WO | WO2016102982 A1 | 6/2016 |
| WO | WO2016133852 A1 | 8/2016 |
| WO | WO2017152166 A1 | 9/2017 |

OTHER PUBLICATIONS

Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Itsenclosures, Product Catalog, 2009, 48 pages.
Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.

(56) References Cited

OTHER PUBLICATIONS

Federman, Cooling Flat Panel Displays, 2011, 4 pages.
Zeeff, T.M., EMC analysis of an 18" LCD monitor, 2000, 1 page.

* cited by examiner

BACK PAN COOLING ASSEMBLY FOR ELECTRONIC DISPLAY

CROSS-REFERENCE TO RELATED APPLICATIONS

This application claims priority to U.S. application Ser. No. 61/714,381 filed on Oct. 16, 2012 and is herein incorporated by reference in its entirety.

TECHNICAL FIELD

Embodiments generally relate to a cooling assembly for the back pan of an electronic display.

BACKGROUND OF THE ART

Electronic displays are now being used for a variety of applications, in addition to the traditional in-home viewing applications. It is now desirable for electronic displays to be used as restaurant menu boards, advertising, and general informational purposes. Each application may require a different set of electronic assemblies, in order to drive the electronic display and provide any ancillary services related to the electronic display and its purpose. Electronic displays are typically manufactured in standard sizes, shapes, and with standard electronic components.

SUMMARY OF THE EXEMPLARY EMBODIMENTS

One exemplary embodiment provides a cooling back pan that is positioned behind the rear pan of an electronic display, where the space between the cooling back pan and the rear pan defines a gap. A fan is preferably positioned so as to cause a flow of ambient air through the gap, cooling the rear pan and the cooling back pan. Electronic components for operating the electronic display can be mounted to the cooling back pan and preferably are placed in conductive thermal communication with the cooling back pan.

The foregoing and other features and advantages of the present invention will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
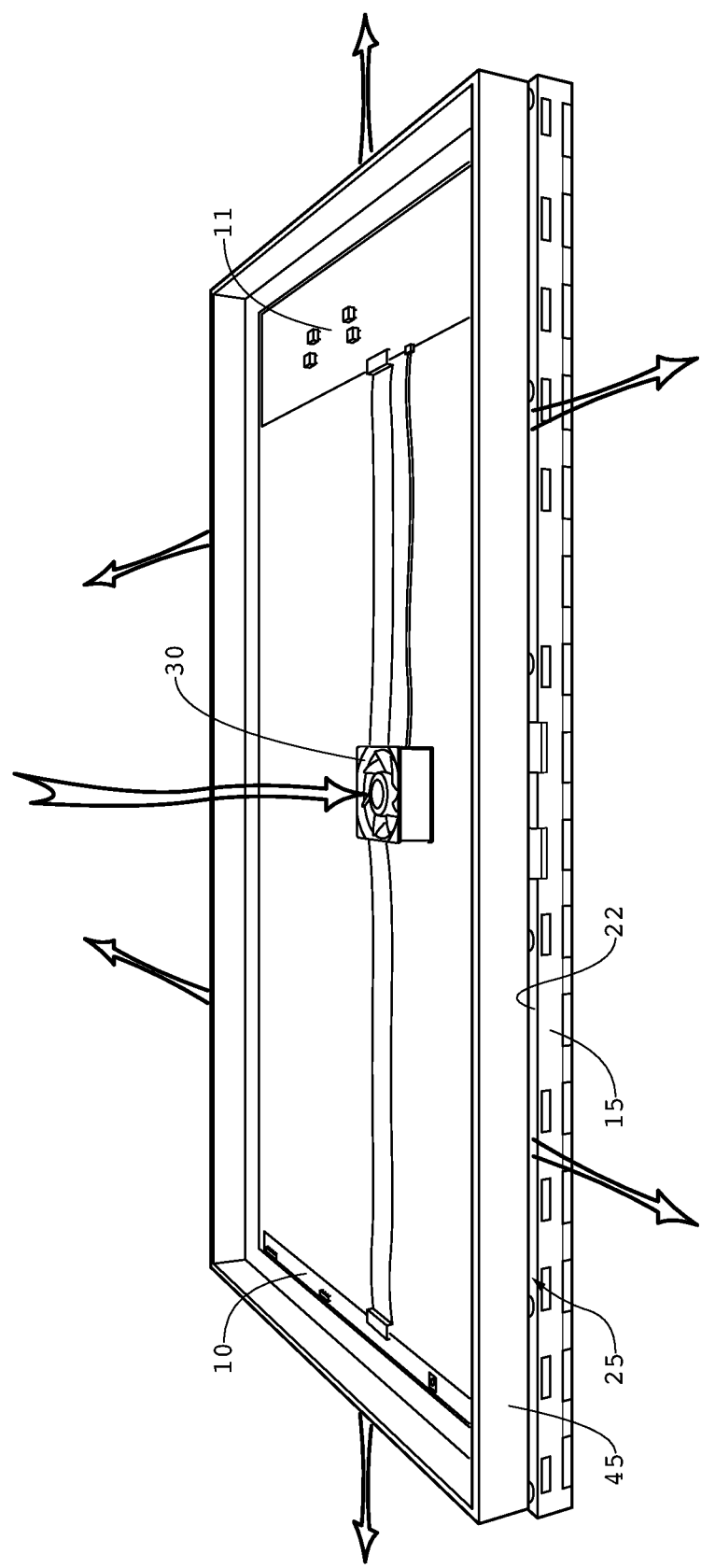
FIG. 1 is a rear perspective view of an exemplary back pan cooling assembly.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a rear perspective view of an exemplary back pan cooling assembly where the rear cover 100 has been removed. An electronic display 15 is provided on the bottom with an exemplary cooling back pan 45 positioned on the top. The electronic display 15 contains a rear pan 22 on the rear surface of the electronic display 15 (i.e. on the side opposing an intended observer). The rear pan 22 is often a component in mass-manufactured electronic displays and typically provides mounts for electronic subassemblies or housings to go with the electronic display. In some embodiments, the rear pan 22 is metallic. As used herein, the term 'rear pan' does not require that the pan is actually the one that came with the originally mass-manufactured display, as this component may be upgraded from its originally mass-manufactured form by downstream manufacturers.

Here, electronic components 10 and 11 for driving the electronic display 15 are fastened to the cooling back pan 45. In an exemplary embodiment, the electronic components 10 and 11 may be placed in conductive thermal communication with the cooling back pan 22. The electronic components 10 and 11 may contain any one of the following: timing and control boards (TCON), power supplies, video cards/drivers/players, input/output interfaces, antennas, wireless receivers, modems, local electronic storage, and CPU/microprocessors.

The space between the rear pan 22 and the exemplary cooling back pan 45 defines an air gap 25. The fan 30 is positioned so as to cause a flow of ambient cooling air through the gap 25, in order to cool both the rear pan 22 and the cooling back pan 45. The fan 30 preferably draws ambient air from around the display housing, without letting the air enter other portions of the display housing, especially the portions of the cooling back pan 45 which contain the electronic components 10 and 11 (i.e. the portions sealed off between the cooling back pan 45 and the rear cover 100). In other words, the fan 30 is preferably placed in sealed gaseous communication with the surrounding ambient air and the gap 25 such that ambient air can pass through the fan 30 and gap 25 without entering the area sealed by the cooling back pan 45 and rear cover 100.

In at least one embodiment, a port 150 is provided which provides sealed gaseous communication between the ambient air surrounding the display housing and the fan 30. Once forced through the gap 25, the cooling air can exit any portion of the perimeter of the rear pan 22 and cooling back pan 45 assemblies, and eventually is exhausted out of the edges of the display housing. In other words, the gap 25 preferably extends to all four edges of the display housing and allows ambient air to enter/exit the gap 25 along all four edges of the rear pan 22 and cooling back pan 45.

Figure 2:
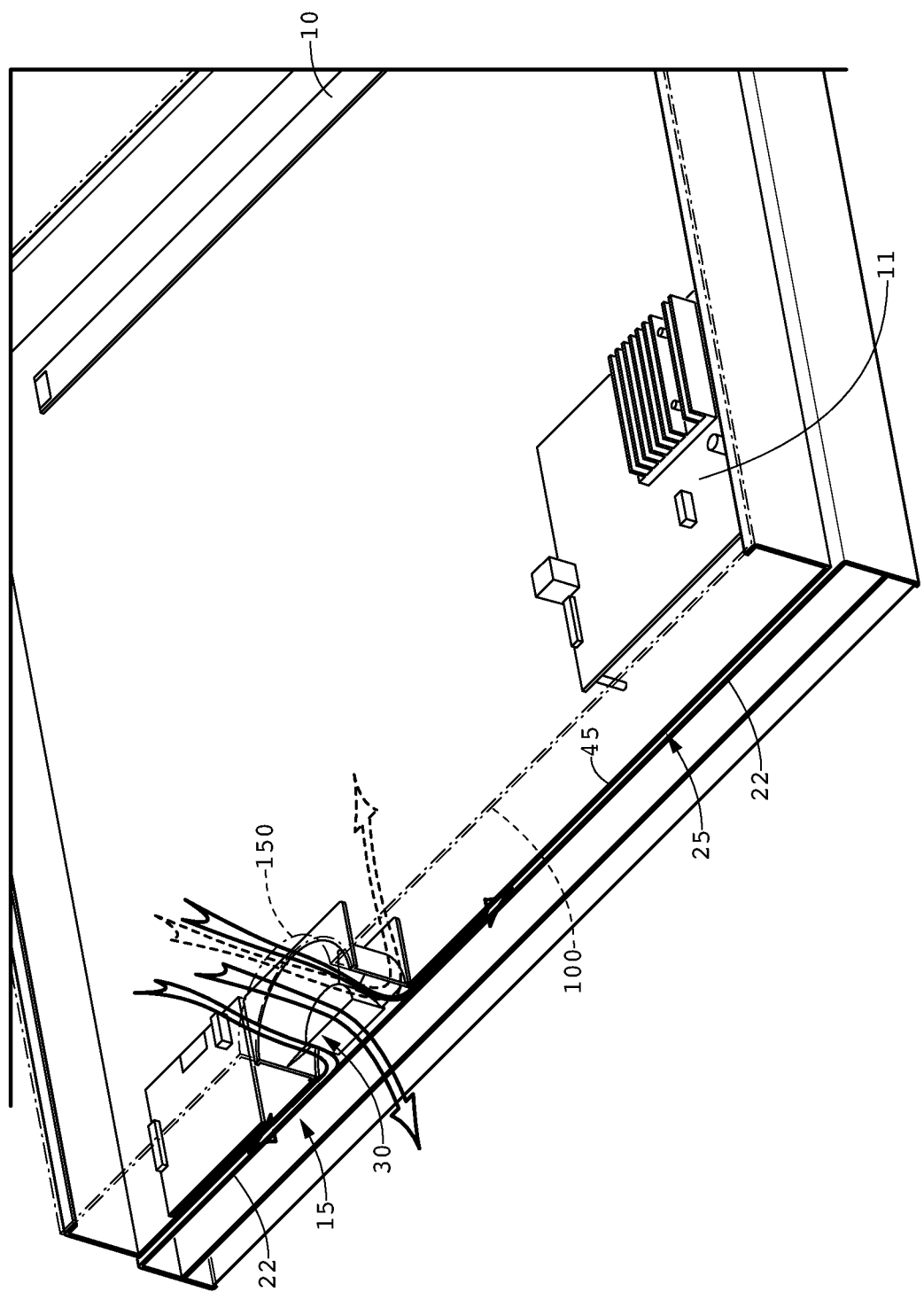
FIG. 2 is a sectional view of the embodiment shown in FIG. 1.

FIG. 2 is a sectional view of the embodiment shown in FIG. 1.

As can be observed, the cooling back pan 45 can be used to mount any number of specialized electrical components 10 and 11 which may be required for the end-use of any electronic display. At the same time, the cooling back pan 45 can help remove heat from the electronic components 10 and 11 as well as the rear pan 22, without exposing the sensitive components to ambient air (which may contain dirt, dust, or contaminates).

It should be noted that although a single fan 30 is shown, this is not required by any embodiment as there can be multiple fans positioned on the cooling back pan 45 in other embodiments. Also, although an exemplary embodiment uses the fan 30 to push the cooling air into the gap 25, alternative embodiments could also be used to draw air from the edges of the display housing, through the gap 25, and exhaust the air through the port 150. It should also be noted that additional fans may be positioned within the cooling back pan 45 in order to circulate air around the interior of the cooling back pan 45, without mixing with the ambient air.

It should also be noted that it is preferable to place the fan 30 near the center of the cooling back pan 45, although this is not required. It may be preferable in some instances to place the fan 30 closer to the horizontal top edge of the cooling back pan 45 (as shown in FIG. 2), as the heat generated by the display assembly tends to rise where additional flow rates of cooling air would be beneficial in this area. In most cases, if using only one fan 30, it may be preferable to place the fan near the vertically-drawn centerline of the cooling back pan 45.

As used herein, the term 'electronic display' is any electronic assembly for generating an image to a viewer. The term specifically includes, but is not limited to: liquid crystal displays (all types), OLED, light emitting diode (LED), field emitting display (FED), light emitting polymer (LEP), organic electro luminescence (OEL), plasma displays, and any other type of thin/flat panel display. In an exemplary embodiment, the electronic display 15 comprises an LED edge lit LCD display where the LED backlight is placed in conductive thermal communication with the rear pan 22. In another exemplary embodiment, the electronic display 15 comprises an LED direct backlit LCD display where the rear pan 22 is provided as the rear surface of the direct LED backlight.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. A back pan cooling assembly for an electronic display having a rear pan, the assembly comprising:
   a cooling back pan having a front surface and a rear surface, wherein said cooling back pan is positioned behind the rear pan;
   a gap located between the cooling back pan and the rear pan;
   a rear cover positioned on the cooling back pan to define a rear compartment formed between the cooling back pan and the rear cover which is substantially sealed to prevent ambient air from entering the rear compartment;
   a port in the rear cover which accepts ambient air;
   a fan positioned and configured to, when operated, cause a flow of ambient air to be ingested through the port and be exhausted through the gap; and
   a power supply or microprocessor for driving the electronic display, the power supply or microprocessor placed at the rear surface of the cooling back pan within the sealed rear compartment and in conductive thermal communication with the cooling back pan;
   wherein the fan is substantially sealed within the rear compartment such that ambient aft is not permitted to contact the power supply or microprocessor.

2. The cooling assembly of claim 1 wherein:
   the electronic display is in conductive thermal communication with the rear pan.

3. The cooling assembly of claim 1 further comprising:
   an LED backlight within the electronic display and placed in thermal communication with the rear pan.

4. The cooling assembly of claim 3 wherein:
   the LED backlight is a direct-lit LED backlight having a front surface and a rear surface; and
   the rear pan comprises the rear surface of the direct-lit LED backlight.

5. The cooling assembly of claim 1 wherein:
   the rear pan and cooling back pan each contain four perimeter edges which are substantially aligned with one another.

6. The cooling assembly of claim 5 wherein:
   the gap extends to all four perimeter edges of the rear pan and cooling back pan.

7. The cooling assembly of claim 5 wherein:
   ambient air is permitted to exit the gap along the four perimeter edges of the rear pan and the cooling back pan.

8. A back pan cooling assembly for an electronic display having a rear pan, the assembly comprising:
   a cooling back pan having a front surface and a rear surface, wherein said cooling back pan is positioned behind the rear pan;
   a gap located between the cooling back pan and the rear pan;
   a rear cover positioned on the cooling back pan to define a rear compartment formed between the cooling back pan and the rear cover which is sealed to prevent ambient air from entering the rear compartment;
   a power supply or microprocessor for driving the electronic display, the power supply or microprocessor placed at the rear surface of the cooling back pan within the sealed rear compartment and in conductive thermal communication with the cooling back pan;
   a port which accepts ambient air;

an open loop gaseous pathway defined by gaseous communication between the port and the gap; and a fan positioned and configured to, when operated cause a flow of ambient air to flow through the open loop gaseous pathway;

wherein the fan is substantially sealed within the rear compartment such that ambient air is not permitted to contact the power supply or microprocessor.

9. The cooling assembly of claim 8 wherein:
the rear pan and the cooling back pan each contain four perimeter edges which are substantially aligned with one another.

10. The cooling assembly of claim 9 wherein:
the gap extends to all of the four perimeter edges of the rear pan and cooling back pan.

11. The cooling assembly of claim 8 wherein:
the fan is oriented such that ambient air is drawn through the port and exhausted out of the gap.

12. The cooling assembly of claim 8 wherein:
the fan is oriented such that ambient air is drawn through the gap and exhausted out of the port.

13. A back pan cooling assembly for an electronic display having a rear pan with a pair of vertical edges and a pair of horizontal edges, the assembly comprising:

a cooling back pan having a pair of vertical edges substantially aligned with the vertical edges of the rear pan and a pair of horizontal edges which are substantially aligned with the horizontal edges of the rear pan;

a gap defined between the cooling back pan and rear pan which extends to each horizontal edge to define a pair of horizontal edge gaps and to each vertical edge to define a pair of vertical edge gaps;

a fan positioned to cause ambient air to flow through the vertical edge gaps and the horizontal edge gaps;

a rear cover positioned on the cooling back pan to define a rear compartment formed between the cooling back pan and the rear cover which is sealed to prevent ambient air from entering the rear compartment;

a port within the rear cover;

an open loop gaseous pathway defined by gaseous communication between the port, fan, the horizontal edge gaps, and the vertical edge gaps; and a power supply or microprocessor for driving the electronic display placed at the rear of the cooling back pan within the sealed rear compartment, wherein the power supply or microprocessor is in conductive thermal communication with the cooling back pan;

wherein the fan is substantially sealed within the rear compartment such that ambient air is not permitted to contact the power supply or microprocessor.

14. The cooling assembly of claim 13 wherein:
the fan is positioned near a center of the cooling back pan.

15. The cooling assembly of claim 13 further comprising:
an LED backlight within the electronic display which is placed in conductive thermal communication with the rear pan.

* * * * *

UNITED STATES PATENT AND TRADEMARK OFFICE
CERTIFICATE OF CORRECTION

PATENT NO. : 10,660,245 B2
APPLICATION NO. : 14/055499
DATED : May 19, 2020
INVENTOR(S) : Dunn et al.

It is certified that error appears in the above-identified patent and that said Letters Patent is hereby corrected as shown below:

In the Claims

In Column 4, Line 27, Claim 1, please delete "aft" and insert -- air --.

Signed and Sealed this
Fifth Day of March, 2024

Katherine Kelly Vidal
*Director of the United States Patent and Trademark Office*